(12) United States Patent
Spitsberg et al.

(10) Patent No.: US 6,960,395 B2
(45) Date of Patent: Nov. 1, 2005

(54) CERAMIC COMPOSITIONS USEFUL FOR THERMAL BARRIER COATINGS HAVING REDUCED THERMAL CONDUCTIVITY

(75) Inventors: Irene Spitsberg, Loveland, OH (US); Venkat Subramanian Venkataramani, Clifton Park, NY (US); Brett Allen Boutwell, Liberty Township, OH (US); Mark Daniel Gorman, West Chester, OH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 10/748,508

(22) Filed: Dec. 30, 2003

(65) Prior Publication Data

US 2005/0142392 A1  Jun. 30, 2005

(51) Int. Cl.$^7$ .................. B32B 15/04; C03C 16/00; F03B 3/12
(52) U.S. Cl. .............. 428/632; 428/633; 428/697; 428/699; 428/701; 428/702; 428/336; 501/103; 501/104; 501/105; 427/453; 427/585; 416/241 B
(58) Field of Search ................ 428/632, 633, 428/697, 699, 701, 702, 336; 501/103, 104, 501/105; 252/62; 427/453, 585, 584, 250, 427/421; 416/241 B

(56) References Cited

U.S. PATENT DOCUMENTS

| | | |
|---|---|---|
| 3,525,597 A | 8/1970 | Mazdiyasni et al |
| 4,535,033 A | 8/1985 | Stecura |
| 5,876,860 A | 3/1999 | Marijnissen et al |
| 6,015,630 A | 1/2000 | Padture et al |
| 6,025,078 A | 2/2000 | Rickerby et al |
| 6,117,560 A | 9/2000 | Maloney |
| 6,177,200 B1 | 1/2001 | Maloney |
| 6,231,991 B1 | 5/2001 | Maloney |
| 6,261,643 B1 | 7/2001 | Hasz et al |
| 6,284,323 B1 | 9/2001 | Maloney |
| 6,312,832 B1 | 11/2001 | Alperine et al |
| 6,333,118 B1 | 12/2001 | Alperine et al |
| 6,447,854 B1 | 9/2002 | Rigney et al |
| 6,461,107 B1 | 10/2002 | Lee et al |
| 6,461,108 B1 | 10/2002 | Lee et al |
| 6,730,422 B2 * | 5/2004 | Litton et al. ............... 428/701 |
| 6,812,176 B1 * | 11/2004 | Zhu et al. ................ 501/102 |
| 2002/0172838 A1 | 11/2002 | Rigney et al |
| 2003/0049470 A1 | 3/2003 | Maloney |

(Continued)

OTHER PUBLICATIONS

Hwang et al, *Grain Size Control Of Tetragonal Zirconia Polycrystals Using the Sapce Charge Concept*, J. Am. Ceram. Soc., (1990), 73(11):3269-77.

(Continued)

Primary Examiner—Jennifer McNeil
(74) Attorney, Agent, or Firm—Eric W. Guttag; Jagtiani + Guttag; David L. Narciso

(57) ABSTRACT

Ceramic compositions comprising at least about 91 mole % zirconia and up to about 9 mole % of a stabilizer component comprising a first metal oxide having selected from the group consisting of yttria, calcia, ceria, scandia, magnesia, india and mixtures thereof. This stabilizer component further comprises a second metal oxide of a trivalent metal atom selected from the group consisting of lanthana, gadolinia, neodymia, samaria, dysprosium, and mixtures thereof and a third metal oxide of a trivalent metal atom selected from the group consisting of erbia, ytterbia and mixtures thereof. These ceramic compositions are useful in preparing thermal barrier coatings having reduced thermal conductivity for the metal substrate of articles that operate at, or are exposed to, high temperatures.

17 Claims, 3 Drawing Sheets

U.S. PATENT DOCUMENTS

| | | |
|---|---|---|
| 2003/0059633 A1 | 3/2003 | Ackerman et al |
| 2003/0077477 A1 | 4/2003 | Bruce et al |
| 2003/0108768 A1 | 6/2003 | Subramanian |
| 2003/0129316 A1 | 7/2003 | Darolia et al |
| 2003/0224200 A1 | 12/2003 | Bruce |

OTHER PUBLICATIONS

Kim, "Effect of $Ta_2O_5$, $Nb_2O_5$, and $HfO_2$ Alloying on the Transformability of $Y_2O_3$-Stablized Tetragonal $ZrO_2$", J. Am. Ceram. Soc., 73(1):115-120.

Nakayama et al., "Effect of $La_2O_3$ Addition on Thermal Stability of Y-TZP," J. Mat. Sci. Lett., 18:1339-41 (1999).

Vassen et al., "Zirconates as New Materials for Thermal Barrier Coatings," J. Am. Ceram. Soc., 83 (8):2023-28 (2000).

U.S. Appl. No. 10/748,516, filed Dec. 30, 2003, Gorman et al.

U.S. Appl. No. 10/748,517, filed Dec. 30, 2003, Boutwell et al.

U.S. Appl. No. 10/748,519, filed Dec. 30, 2003, Darolia et al.

U.S. Appl. No. 10/748,520, filed Dec. 30, 2003, Spitsberg et al.

U.S. Appl. No. 10/748,521, filed Dec. 30, 2003, Spitsberg et al.

U.S. Appl. No. 10/748,518, filed Dec. 30, 2003, Spitsberg et al.

U.S. Appl. No. 10/748,513, filed Dec. 30, 2003, Spitsberg et al.

\* cited by examiner

CERAMIC COMPOSITIONS USEFUL FOR THERMAL BARRIER COATINGS HAVING REDUCED THERMAL CONDUCTIVITY

STATEMENT REGARDING FEDERALLY SPONSORED RESEARCH

This invention was made with Government support under Contract No. N00019-96-C-0176 awarded by JSF Program Office. The Government has certain rights to the invention.

BACKGROUND OF THE INVENTION

This invention relates to ceramic compositions for thermal barrier coatings having reduced thermal conductivity comprising zirconia and a stabilizer component having a first metal oxide such as yttria, a second metal oxide such as lanthana or gadolinia, and a third metal oxide such as ytterbia. This invention further relates to coatings prepared from such compositions, articles having such coatings and methods for preparing such coatings for the article.

Components operating in the gas path environment of gas turbine engines are typically subjected to significant temperature extremes and degradation by oxidizing and corrosive environments. Environmental coatings and especially thermal barrier coating are an important element in current and future gas turbine engine designs, as well as other articles that are expected to operate at or be exposed to high temperatures, and thus cause the thermal barrier coating to be subjected to high surface temperatures. Examples of turbine engine parts and components for which such thermal barrier coatings are desirable include turbine blades and vanes, turbine shrouds, buckets, nozzles, combustion liners and deflectors, and the like. These thermal barrier coatings typically comprise the external portion or surface of these components are usually deposited onto a metal substrate (or more typically onto a bond coat layer on the metal substrate for better adherence) from which the part or component is formed to reduce heat flow (i.e., provide thermal insulation) and to limit (reduce) the operating temperature the underlying metal substrate of these parts and components is subjected to. This metal substrate typically comprises a metal alloy such as a nickel, cobalt, and/or iron based alloy (e.g., a high temperature superalloy).

The thermal barrier coating is usually prepared from a ceramic material, such as a chemically (metal oxide) stabilized zirconia. Examples of such chemically stabilized zirconias include yttria-stabilized zirconia, scandia-stabilized zirconia, ceria-stabilized zirconia, calcia-stabilized zirconia, and magnesia-stabilized zirconia. The thermal barrier coating of choice is typically a yttria-stabilized zirconia ceramic coating. A representative yttria-stabilized zirconia thermal barrier coating usually comprises about 7 weight % yttria and about 93 weight % zirconia. The thickness of the thermal barrier coating depends upon the metal substrate part or component it is deposited on, but is usually in the range of from about 3 to about 70 mils (from about 75 to about 1795 microns) thick for high temperature gas turbine engine parts.

Thermal barrier coatings comprising yttria-stabilized zirconia are usually formed on or applied to a bond coat layer of a superalloy metal substrate, such as those used in turbine airfoils, by physical vapor deposition (PVD), such as electron beam physical vapor deposition (EB-PVD) or plasma spray, such as air plasma spray (APS) techniques. Thermal barrier coatings deposited by EB-PVD techniques have a columnar, strain-tolerant microstructure that enhances the spallation performance of the deposited coating. The resistance to heat flow through this coating structure is enhanced by the defect matrix in this structure created by the "dissolving" of yttria (the dopant oxide) into zirconia, as well as process-induced porosity. This EB-PVD deposited yttria-stabilized coating provides a "feathery" microstructure that is the result of the presence of sub-grains within the columns of the coating. These sub-grain interface boundaries can be viewed as being low-angle grain boundaries formed by porosity within the columns. It is believed that the boundaries between the sub-grains make the major contribution to the reduced thermal conductivity of the EB-PVD formed thermal barrier coating structure (when compared to the bulk ceramic).

When exposed to higher engine operating temperatures, this "feathery" microstructure begins to sinter. (This sintering process also partially takes place during the deposition of the coating by EB-PVD.) It has been found that this sintering occurs due to diffusion at the grain and sub-grain boundaries caused by the presence of defects in this microstructure. This results in coarsening and collapsing of the original porosity, as well as a reduction of the interface boundary area. These microstructural changes that occur at elevated temperatures enhance the thermal conductivity of the thermal barrier coating, and thus reduce the thermal insulation of the underlying metal substrate. Indeed, this sintering process can increase the thermal conductivity of the thermal barrier coating by as much as 20 to 30%.

While this sintering process is particularly evident in EB-PVD deposited yttria-stabilized zirconia thermal barrier coatings, similar effects can occur in such coatings deposited by plasma spraying. In the case of plasma sprayed yttria-stabilized zirconia thermal barrier coatings, the splat boundaries are the conductivity reducing feature of such coatings. As a result, any sintering that would occur at such boundaries would be undesirable.

Accordingly, it would be desirable to minimize or reduce this sintering process so as to maintain the insulating efficacy of the thermal barrier coating for the life of the coating, especially with regard to coatings formed by EB-PVD techniques. It would be further desirable to be able to modify the chemical composition of yttria-stabilized zirconia-based thermal barrier coating systems to reduce this sintering tendency and thus maintain or improve the reduced thermal conductivity of such coatings.

BRIEF DESCRIPTION OF THE INVENTION

An embodiment of this invention relates to ceramic compositions for preparing a thermal barrier coating having reduced thermal conductivity for an underlying metal substrate of articles that operate at, or are exposed, to high temperatures. These compositions comprise:
1. at least about 91 mole % zirconia; and
2. a stabilizing amount up to about 9 mole % of a stabilizer component comprising:
    a. a first metal oxide selected from the group consisting of yttria, calcia, ceria, scandia, magnesia, india and mixtures thereof;
    b. a second metal oxide of a trivalent metal atom selected from the group consisting of lanthana, gadolinia, neodymia, samaria, dysprosia, and mixtures thereof; and
    c. a third metal oxide of a trivalent metal atom selected from the group consisting of ytterbia, erbia and mixtures thereof.

Another embodiment of this invention relates to a thermally protected article. This protected article comprises:
A. a metal substrate;
B. optionally a bond coat layer adjacent to and overlaying the metal substrate; and
C. a thermal barrier coating (prepared from the previously described ceramic composition) adjacent to and overlaying the bond coat layer (or overlaying the metal substrate if the bond coat layer is absent).

Another embodiment of this invention relates to a method for preparing the thermal barrier coating on a metal substrate to provide a thermally protected article. This method comprises the steps of:
A. optionally forming a bond coat layer on the metal substrate; and
B. depositing on the bond coat layer (or on the metal substrate in the absence of the bond coat layer) the ceramic composition previously described to form a thermal barrier coating.

The ceramic compositions of this invention provide several benefits when used to provide thermal barrier coatings for metal substrates of articles exposed to high temperatures, such as turbine components. Thermal barrier coatings prepared from these ceramic compositions have a reduced or minimized tendency to sinter, including coatings prepared by physical vapor deposition (PVD) techniques, such as electron beam physical vapor deposition (EB-PVD) that form columnar, strain-tolerant microstructures. Thermal barrier coatings prepared from these ceramic compositions can also possess reduced intrinsic conductivity. As a result, the thermal barrier coatings prepared from these ceramic compositions are able to maintain their reduced thermal conductivity over time and during exposure to higher temperatures, as well as temperature cycling.

DETAILED DESCRIPTION OF THE INVENTION

Figure 1:
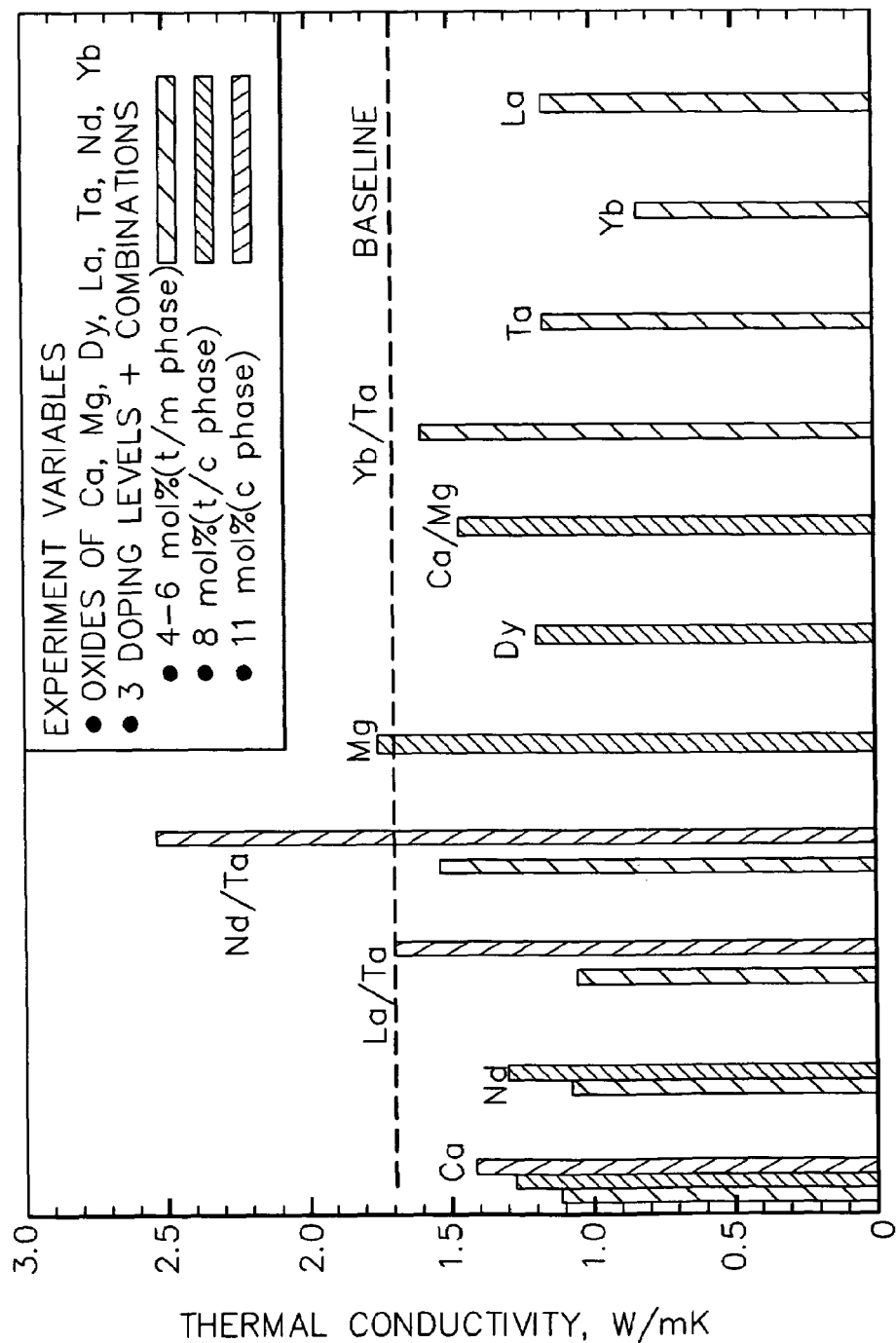
FIG. 1 represents a bar graph showing the thermal conductivity of thermal barrier coatings prepared from zirconia-containing ceramic compositions having various metal oxide additions.

As used herein, the term "thermal barrier coating" refers to those coatings that are capable of reducing heat flow to the underlying metal substrate of the article, i.e., forming a thermal barrier.

As used herein, the term "comprising" means various compositions, compounds, components, layers, steps and the like can be conjointly employed in the present invention. Accordingly, the term "comprising" encompasses the more restrictive terms "consisting essentially of" and "consisting of."

All amounts, parts, ratios and percentages used herein are by mole % unless otherwise specified.

The ceramic compositions of this invention impart improved thermal conductivity properties to the resulting thermal barrier coatings, and in particular lower thermal conductivity. Thermal conductivity K is defined by the following equation (1):

$$K = \alpha \times (1-p) \times C_p \times D_t \qquad (1)$$

where $\alpha$ is the thermal diffusivity, p is the fraction of porosity, $C_p$ is the specific heat (in J/gK), and $D_t$ is the theoretical density. As be seen from equation (1) above, the thermal conductivity depends on thermal diffusivity and porosity. Thermal diffusivity, which is affected by the coating composition and microstructure (i.e., the higher stability of the internal boundaries, the lower thermal diffusivity) is the focus of the ceramic compositions of this invention in terms of improving, and especially lowering the thermal conductivity of the resulting thermal barrier coating.

The thermal barrier coating compositions of this invention comprise at least about 91 mole % zirconia. Typically, the compositions of this invention comprise from about 91 to about 97 mole % zirconia, more typically from about 92 to about 95 mole % zirconia. The compositions of this invention further comprise a stabilizing amount up to about 9 mole % of a stabilizing component comprising a first metal oxide, a second metal oxide and a third metal oxide. The particular amount of the stabilizing component that is "stabilizing" will depend on a variety of factors, including the thermal insulating properties desired, the ability to minimize or reduce sintering of the resultant coating, the particular amounts and types of first, second and third metal oxides used and like factors. Typically, the stabilizing component comprises from about 3 to about 9 mole %, more typically from about from about 5 to about 8 mole %, of the composition.

The first metal oxide can be selected from the group consisting of yttria, calcia, ceria, scandia, magnesia, india and mixtures thereof. The particular amount of the first metal oxide will depend on a variety of factors, including the thermal insulating properties desired, the ability to minimize or reduce sintering of the resultant coating, the particular first metal oxide used, the amounts and types of second metal oxide used and like factors. Typically the first metal oxide comprises from about 3 to about 6 mole %, more typically from about 3 to about 5 mole %, of the ceramic composition. Ceramic compositions of this invention typically comprise yttria as the first metal oxide.

The ceramic compositions of this invention having improved thermal conductivity properties are based on the discovery that, to achieve any further reduction in thermal conductivity beyond that provided by the first metal oxide, a different mechanism is used. This mechanism involves including in the stabilizing component of these ceramic compositions comprising zirconia certain trivalent (i.e., 3+) dopant metal oxides (i.e., "second metal" and "third metal" oxides). Inclusion of these second and third metal oxides in the stabilizing component of these ceramic compositions imparts significant benefits to the resulting thermal barrier coating, including one or more of the following: (a) reducing the defect concentration at the grain boundaries or interfaces by forming stable compounds with reduced concentrations of both metal ion (i.e., cationic) and oxygen (i.e., anionic) defects; (b) enhancing segregation of higher (i.e., larger) atomic radius and/or higher (i.e., heavier) atomic mass metal oxides to the interface to reduce the diffusion processes along such boundaries or interfaces; and (c) creating additional phonon scattering defects within the zirconia lattice. Mechanisms (a) and (b) reduce the tendency of the ceramic structure to sinter, thus providing the benefit of preserving lower conductivity, while mechanism (c) provides additional reduction of the intrinsic conductivity.

In particular, it is believed that the stabilizing component of this ceramic composition causes minimized or reduced sintering of the thermal barrier coating prepared from therefrom because one or more of the following effects. The first metal oxide, such as yttria, has a strong tendency to segregate at the grain interfaces of the thermal barrier coating. This segregation reduces the crystal lattice defect concentration at the grain interface in the coating structure and thus substantially reduces diffusion processes at the ceramic grain interfaces that can cause sintering during initial thermal barrier coating formation (e.g., by EB-PVD) and in subsequent aging of the coating. Diffusion processes along the grain interfaces may also be reduced or retarded due to the increase formation of stable components between the first metal oxide and zirconia at these grain interfaces (e.g., zirconate type components such as pyrochlores formed between zirconia and yttria). Including the second metal oxide having a metal atom (e.g., lanthanum or gadolinium) of radii larger than the metal atom of the first metal oxide (e.g., yttrium) enhances segregation of first metal oxide, and at a certain first metal oxide/second metal oxide ratios, can cause formation of zirconate-type components at the intracolumnar boundaries. Including the third metal oxides having smaller radii metal atoms (e.g., ytterbium) than those of the first metal oxide will distort the zirconium-oxygen interatomic distances in the M-O—Y coordination complex, e.g., Zr—O—Y, resulting in a breakdown of the chemical bond structure and segregation of the second metal oxides of the smaller atom. The third metal oxides of such smaller but heavier atoms, such as ytterbium, can also reduce diffusion processes along the internal boundaries of the ceramic layer.

Figure 2:
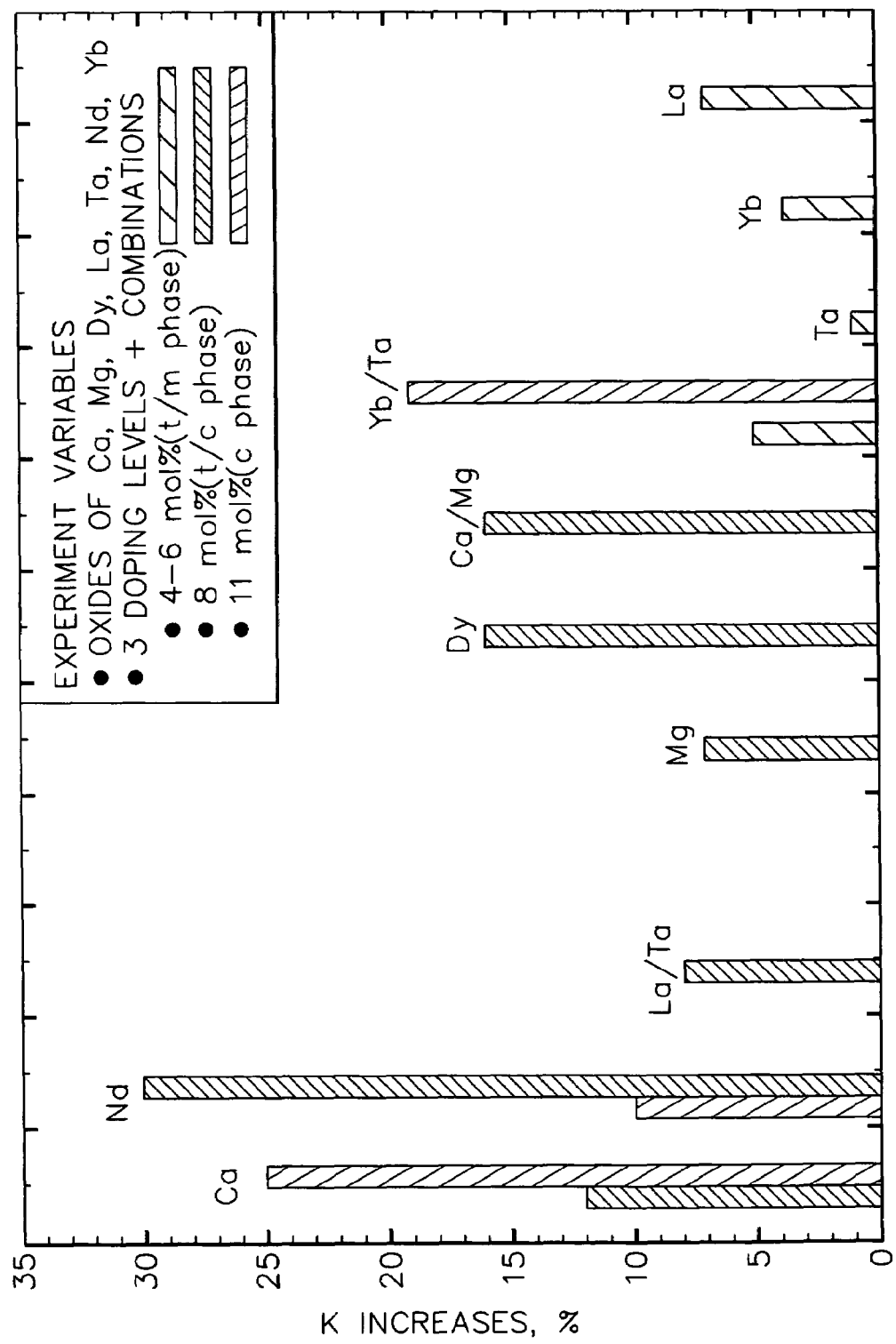
FIG. 2 represents a bar graph showing the percentage increase in thermal conductivity of some of the thermal barrier coatings shown in FIG. 1.

The benefits from the inclusion of these second and third metal oxides on the thermal conductivity of the thermal barrier coatings prepared from these ceramic compositions is particularly shown in FIG. 1. FIG. 1 represents the thermal conductivity of thermal barrier coatings prepared from zirconia-containing ceramic compositions having various metal oxide additions, including combinations of metal oxides. The levels of metal oxide addition used in this evaluation are 4–6 mole %, 8 mole % and 11 mole %. The conductivity of the resulting coatings is evaluated after being aged at 1200° C. for 2 hours in air. The dashed baseline shown in FIG. 1 represents the thermal conductivity of a coating prepared from a zirconia-containing ceramic composition comprising 3.95 mole % yttria addition only. As can be seen in FIG. 1, coatings prepared from ceramic compositions having 4 to 6 mole % stabilizing component addition had the lowest thermal conductivities. The percentage increase in thermal conductivity, relative to the conductivity of the same coating before aging of some of the coatings in FIG. 1 is represented as a bar graph in FIG. 2. FIG. 2 shows that this anti-sintering effect is defined by both the type and amount of the stabilizing component.

Suitable second metal oxides have the formula $B_2O_3$ where B is a trivalent (i.e., 3+) metal atom selected from lanthanum, gadolinium, neodymium, samarium, dysprosium, i.e., the second metal oxide can be selected from the group consisting of lanthana, gadolinia, neodymia, samaria, dysprosia, and mixtures thereof. The particular amount of the second metal oxide will depend on a variety of factors, including the thermal insulating properties desired, the ability to minimize or reduce sintering of the resultant coating, the particular second metal oxide used, the amounts and types of first and third metal oxides used and like factors. Typically the second metal oxide comprises from about 0.25 to about 2 mole %, more typically from about 0.5 to about 1.5 mole %, of the ceramic composition. Compositions of this invention typically comprise lanthana or gadolinia as the second metal oxide, and more typically lanthana.

The third metal oxide has the formula $D_2O_3$ where D is a trivalent metal selected from erbium and ytterbium, i.e., the third metal oxide can be selected from the group consisting of erbia, ytterbia, and mixtures thereof. The particular amount of the third metal oxide will depend on a variety of factors, including the thermal insulating properties desired, the ability to minimize or reduce sintering of the resultant coating, the particular third metal oxide used, the amounts and types of first and second metal oxides used and like factors. Typically the third metal oxide comprises from about 0.5 to about 2 mole %, more typically from about 0.5 to about 1.5 mole %, of the ceramic composition. Compositions of this invention typically comprise ytterbia as the third metal oxide. The ratio of the second metal oxide to the third metal oxide is typically in the range of from about 0.5 to about 2, more typically from about 0.75 to about 1.33.

Thermal barrier coatings prepared from the ceramic compositions of this invention are useful with a wide variety of turbine engine (e.g., gas turbine engine) parts and components that are formed from metal substrates comprising a variety of metals and metal alloys, including superalloys, and are operated at, or exposed to, high temperatures, especially higher temperatures that occur during normal engine operation. These turbine engine parts and components can include turbine airfoils such as blades and vanes, turbine shrouds, turbine nozzles, combustor components such as liners and deflectors, augmentor hardware of gas turbine engines and the like. The thermal barrier coatings of this invention can also cover a portion or all of the metal substrate. For example, with regard to airfoils such as blades, the thermal barrier coatings of this invention are typically used to protect, cover or overlay portions of the metal substrate of the airfoil rather than the entire component, e.g., the thermal barrier coatings cover the leading and trailing edges and other surfaces of the airfoil, but not the attachment area. While the following discussion of the thermal barrier coatings of this invention will be with reference to metal substrates of turbine engine parts and components, it should also be understood that the thermal barrier coatings of this invention are useful with metal substrates of other articles that operate at, or are exposed to, high temperatures.

Figure 3:
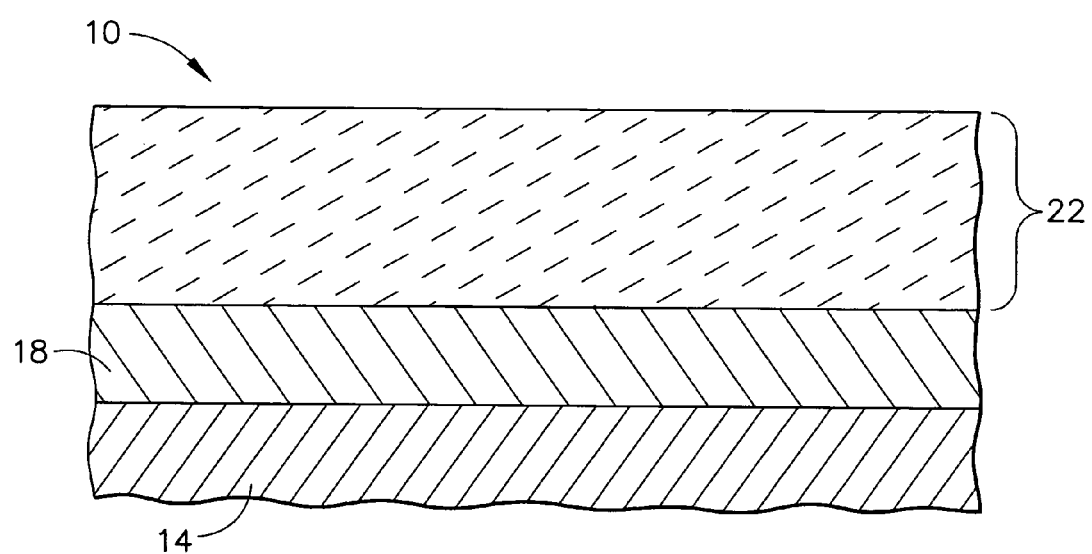
FIG. 3 is a partial side sectional view of an embodiment of the thermal barrier coating and coated article of this invention.

The various embodiments of the thermal barrier coatings of this invention are further illustrated by reference to the drawings as described hereafter. Referring to the drawings, FIG. 3 shows a partial side sectional view of an embodiment of the thermal barrier coating used with the metal substrate of an article indicated generally as 10. As shown in FIG. 3, article 10 has a metal substrate indicated generally as 14. Substrate 14 can comprise any of a variety of metals, or more typically metal alloys, that are typically protected by thermal barrier coatings, including those based on nickel, cobalt and/or iron alloys. For example, substrate 14 can comprise a high temperature, heat-resistant alloy, e.g., a superalloy. Such high temperature alloys are disclosed in various references, such as U.S. Pat. No. 5,399,313 (Ross et al), issued Mar. 21, 1995 and U.S. Pat. No. 4,116,723 (Gell et al), issued Sep. 26, 1978, both of which are incorporated by reference. High temperature alloys are also generally described in Kirk-Othmer's Encyclopedia of Chemical Technology, 3rd Ed., Vol. 12, pp. 417–479 (1980), and Vol. 15, pp. 787–800 (1981). Illustrative high temperature nickel-based alloys are designated by the trade names Inconel®, Nimonic®, Rene® (e.g., Rene® 80-, Rene® N5 alloys), and Udimet®. As described above, the type of substrate 14 can vary widely, but it is representatively in the form of a turbine part or component, such as an airfoil (e.g., blade) or turbine shroud.

As shown in FIG. 3, article 10 can also include a bond coat layer indicated generally as 18 that is adjacent to and overlies substrate 14. Bond coat layer 18 is typically formed from a metallic oxidation-resistant material that protects the underlying substrate 14 and enables the thermal barrier coating indicated generally as 22 to more tenaciously adhere to substrate 14. Suitable materials for bond coat layer 18 include MCrAlY alloy powders, where M represents a metal such as iron, nickel, platinum or cobalt, or NiAl(Zr) compositions, as well as various Noble metal diffusion aluminides such as nickel aluminide and platinum aluminide, as well as simple aluminides (i.e., those formed without Noble metals). This bond coat layer 18 can be applied, deposited or otherwise formed on substrate 10 by any of a variety of conventional techniques, such as physical vapor deposition (PVD), including electron beam physical vapor deposition (EB-PVD), plasma spray, including air plasma spray (APS) and vacuum plasma spray (VPS), or other thermal spray deposition methods such as high velocity oxy-fuel (HVOF) spray, detonation, or wire spray, chemical vapor deposition (CVD), pack cementation and vapor phase aluminiding in the case of metal diffusion aluminides (see, for example, U.S. Pat. No. 4,148,275 (Benden et al), issued Apr. 10, 1979; U.S. Pat. No. 5,928,725 (Howard et al), issued Jul. 27, 1999; and See U.S. Pat. No. 6,039,810 (Mantkowski et al), issued Mar. 21, 2000, all of which are incorporated by reference and which disclose various apparatus and methods for applying diffusion aluminide coatings, or combinations of such techniques, such as, for example, a combination of plasma spray and diffusion aluminide techniques. Typically, plasma spray or diffusion techniques are employed to deposit bond coat layer 18. Usually, the deposited bond coat layer 18 has a thickness in the range of from about 1 to about 20 mils (from about 25 to about 500 microns). For bond coat layers 18 deposited by PVD techniques such as EDPVD or diffusion aluminide processes, the thickness is more typically in the range of from about 1 about 3 mils (from about 25 to about 75 microns). For bond coat layers deposited by plasma spray techniques such as APS, the thickness is more typically in the range of from about 3 to about 15 mils (from about 75 to about 385 microns).

As shown in FIG. 3, thermal barrier coating (TBC) 22 prepared from the ceramic composition of this invention is adjacent to and overlies bond coat layer 18. The thickness of TBC 22 is typically in the range of from about 1 to about 100 mils (from about 25 to about 2564 microns) and will depend upon a variety of factors, including the article 10 that is involved. For example, for turbine shrouds, TBC 22 is typically thicker and is usually in the range of from about 30 to about 70 mils (from about 769 to about 1795 microns), more typically from about 40 to about 60 mils (from about 1333 to about 1538 microns). By contrast, in the case of turbine blades, TBC 22 is typically thinner and is usually in the range of from about 1 to about 30 mils (from about 25 to about 769 microns), more typically from about 3 to about 20 mils (from about 77 to about 513 microns).

In forming TBCs 22, the ceramic compositions of this invention can be applied, deposited or otherwise formed on bond coat layer 18 by any of a variety of conventional techniques, such as physical vapor deposition (PVD), including electron beam physical vapor deposition (EB-PVD), plasma spray, including air plasma spray (APS) and vacuum plasma spray (VPS), or other thermal spray deposition methods such as high velocity oxy-fuel (HVOF) spray, detonation, or wire spray; chemical vapor deposition (CVD), or combinations of plasma spray and CVD techniques. The particular technique used for applying, depositing or otherwise forming TBC 22 will typically depend on the composition of TBC 22, its thickness and especially the physical structure desired for TBC 22. For example, PVD techniques tend to be useful in forming TBCs having a strain-tolerant columnar structure. By contrast, plasma spray techniques (e.g., APS) tend to create a sponge-like porous structure of open pores. TBC 22 is typically formed from ceramic compositions of this invention by PVD, and especially EB-PVD techniques to provide a strain-tolerant columnar structure.

Various types of PVD and especially EB-PVD techniques well known to those skilled in the art can also be utilized to form TBCs 22 from the ceramic compositions of this invention. See, for example, U.S. Pat. No. 5,645,893 (Rickerby et al), issued Jul. 8, 1997 (especially col. 3, lines 36–63) and U.S. Pat. No. 5,716,720 (Murphy), issued Feb. 10, 1998) (especially col. 5, lines 24–61) and U.S. Pat. No. 6,447,854 (Rigney et al), issued Sep. 10, 2002, which are all incorporated by reference. Suitable EB-PVD techniques for use herein typically involve a coating chamber with a gas (or gas mixture) that preferably includes oxygen and an inert gas, though an oxygen-free coating atmosphere can also be employed. The ceramic thermal barrier coating materials are then evaporated with electron beams focused on, for example, ingots of the ceramic thermal barrier coating materials so as to produce a vapor of metal ions, oxygen ions and one or more metal oxides. The metal and oxygen ions and metal oxides recombine to form TBC 22 on the surface of metal substrate 14, or more typically on bond coat layer 18.

Various types of plasma-spray techniques well known to those skilled in the art can also be utilized to form TBCs 22 from the ceramic compositions of this invention. See, for example, Kirk-Othmer Encyclopedia of Chemical Technology, 3rd Ed., Vol. 15, page 255, and references noted therein, as well as U.S. Pat. No. 5,332,598 (Kawasaki et al), issued Jul. 26, 1994; U.S. Pat. No. 5,047,612 (Savkar et al) issued Sep. 10, 1991; and U.S. Pat. No. 4,741,286 (Itoh et al), issued May 3, 1998 (herein incorporated by reference) which are instructive in regard to various aspects of plasma spraying suitable for use herein. In general, typical plasma spray techniques involve the formation of a high-temperature plasma, which produces a thermal plume. The ceramic coating composition, e.g., ceramic powders, are fed into the plume, and the high-velocity plume is directed toward the bond coat layer 18. Various details of such plasma spray coating techniques will be well-known to those skilled in the art, including various relevant steps and process parameters such as cleaning of the bond coat surface 18 prior to deposition; grit blasting to remove oxides and roughen the surface substrate temperatures, plasma spray parameters such as spray distances (gun-to-substrate), selection of the number of spray-passes, powder feed rates, particle velocity, torch power, plasma gas selection, oxidation control to adjust oxide stoichiometry, angle-of-deposition, post-treatment of the applied coating; and the like. Torch power can vary in the range of about 10 kilowatts to about 200 kilowatts, and in preferred embodiments, ranges from about 40 kilowatts to about 60 kilowatts. The velocity of the ceramic coating composition particles flowing into the plasma plume (or plasma "jet") is another parameter which is usually controlled very closely. Suitable plasma spray systems are described in, for example, U.S. Pat. No. 5,047,612 (Savkar et al) issued Sep. 10, 1991, which is incorporated by reference.

While specific embodiments of the method of the present invention have been described, it will be apparent to those skilled in the art that various modifications thereto can be made without departing from the spirit and scope of the present invention as defined in the appended claims.

What is claimed is:

1. A ceramic composition, which comprises:
   1. from about 92 to about 95 mole % zirconia; and
   2. from about 5 to about 8 mole % of a stabilizer component comprising:
      a. a first metal oxide selected from the group consisting of yttria, calcia, ceria, scandia, magnesia, india and mixtures thereof in amount of from about 3 to about 5 mole %;
      b. a second metal oxide of a trivalent metal atom selected from the group consisting of lanthana, and mixtures of lanthana with gadolinia, neodymia, samaria, or dysprosia, in an amount of from about 0.25 to about 2 mole %; and
      c. ytterbia in an amount of from about 0.5 to about 2 mole %.

2. The composition of claim 1 which comprises the second metal oxide and ytterbia in a ratio of the amount of the second metal oxide to ytterbia of from about 0.75 to about 1.33.

3. The composition of claim 1 wherein the second metal oxide is lanthana.

4. A thermally protected article, which comprises:
   A. a metal substrate; and
   A. a thermal barrier coating comprising:
      1. from about 92 to about 95 mole % zirconia; and
      2. from about 5 to about 8 mole % of a stabilizer component comprising:
         a. a first metal oxide selected from the group consisting of yttria, calcia, ceria, scandia, magnesia, india and mixtures thereof in amount of from about 3 to about 5 mole %;
         b. a second metal oxide of a trivalent metal atom selected from the group consisting of lanthana, and mixtures of lanthana with gadolinia, neodymia, samaria, or dysprosia, in an amount of from about 0.25 to about 2 mole %; and
         c. ytterbia in an amount of from about 0.5 to about 2 mole %.

5. The article of claim 4 which further comprises a bond coat layer adjacent to and overlaying the metal substrate and wherein the thermal barrier coating is adjacent to and overlies the bond coat layer.

6. The article of claim 5 wherein the thermal barrier coating has a thickness of from about 1 to 100 mils.

7. The article of claim 6 wherein the thermal barrier coating has a strain-tolerant columnar structure.

8. The article of claim 7 which is a turbine engine component.

9. The article of claim 8 which is a turbine shroud and wherein the thermal barrier coating has a thickness of from about 30 to about 70 mils.

10. The article of claim 8 which is a turbine airfoil and wherein the thermal barrier coating has a thickness of from about 3 to about 15 mils.

11. The article of claim 4 wherein the thermal barrier coating comprises the second metal oxide and ytterbia in a ratio of the amount of the second metal oxide ytterbia of from about 0.75 to about 1.33.

12. The article of claim 4 wherein the second metal oxide is lanthana.

13. A method for preparing a thermal barrier coating on an underlying metal substrate, the method comprising the step of:
   A. forming a thermal barrier coating over the metal substrate by depositing a ceramic composition, which comprises:
      1. from about 92 to about 95 mole % zirconia; and
      2. from about 5 to about 8 mole % of a stabilizer component comprising:
         a. a first metal oxide selected from the group consisting of yttria, calcia, ceria, scandia, magnesia, india and mixtures thereof in amount of from about 3 to about 5 mole %; and
         b. a second metal oxide of a trivalent metal atom selected from the group consisting of lanthana, and mixtures of lanthana with gadolinia, neodymia, samaria, or dysprosia, in an amount of from about 0.25 to about 2 mole %; and
         c. ytterbia in an amount of from about 0.5 to about 2 mole %.

14. The method of claim 13 wherein a bond coat layer is adjacent to and overlies the metal substrate and wherein the thermal barrier coating is formed on the bond coat layer.

15. The method of claim 14 wherein the ceramic composition is deposited by physical vapor deposition to form a thermal barrier coating having a strain-tolerant columnar structure.

16. The method of claim 13 wherein the ceramic composition that is deposited comprises the second metal oxide and ytterbia in a ratio of the amount of the second metal oxide to ytterbia of from about 0.75 to about 1.33.

17. The method of claim 16 wherein the ceramic composition that is deposited comprises lanthana as the second metal oxide.

* * * * *